US012810052B2

(12) United States Patent
Kuo et al.

(10) Patent No.: US 12,810,052 B2
(45) Date of Patent: Nov. 24, 2026

(54) SILICON PHOTONICS SYSTEM

(71) Applicant: Taiwan Semiconductor Manufacturing Company, Ltd., Hsinchu (TW)

(72) Inventors: Feng-Wei Kuo, Zhudong Township (TW); Yu-Hao Chen, HsinChu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 872 days.

(21) Appl. No.: 18/155,980

(22) Filed: Jan. 18, 2023

(65) Prior Publication Data

US 2023/0385515 A1 Nov. 30, 2023

Related U.S. Application Data

(60) Provisional application No. 63/377,798, filed on Sep. 30, 2022, provisional application No. 63/345,750, filed on May 25, 2022.

(51) Int. Cl.
*G06F 30/00* (2020.01)
*G06F 30/394* (2020.01)
*G06F 30/398* (2020.01)

(52) U.S. Cl.
CPC .......... *G06F 30/394* (2020.01); *G06F 30/398* (2020.01)

(58) Field of Classification Search
USPC ..... 716/51, 52, 110, 111, 112, 118, 119, 126
See application file for complete search history.

(56) References Cited

U.S. PATENT DOCUMENTS

| | | | | |
|---|---|---|---|---|
| 10,331,842 | B2 | 6/2019 | Alloatti | |
| 10,650,110 | B2 | 5/2020 | Van Vaerenbergh et al. | |
| 10,929,590 | B2 | 2/2021 | Cao et al. | |
| 2016/0224697 | A1 | 8/2016 | Yang et al. | |
| 2021/0057365 | A1 * | 2/2021 | Kuo | G06F 30/398 |
| 2022/0197129 | A1 | 6/2022 | Chen et al. | |

FOREIGN PATENT DOCUMENTS

WO WO-2020086181 A2 * 4/2020 .......... G06F 30/327

* cited by examiner

*Primary Examiner* — Brian Ngo
(74) *Attorney, Agent, or Firm* — Merchant & Gould P.C.

(57) ABSTRACT

Silicon Photonics (SiPh) device methods and systems include providing a PDK cell library with parameters for standard SiPh device parameterized cells (Pcells). A custom SiPh layout that includes a plurality of dummy layers defining a custom SiPh device Pcell is created. A schematic including a plurality of the standard SiPh device Pcells and the custom SiPh device Pcell is created, as well as a configuration database correlating the standard SiPh device Pcells and the custom SiPh Pcell to the schematic. The standard SiPh device Pcells and the custom SiPh Pcell are automatically placed and routed based on the configuration database. A plurality of LVS rules are determined based on the dummy layers, and conducting an LVS verification is conducted based on the LVS rules.

20 Claims, 12 Drawing Sheets

```
************************************
* Library Name:  SiPh_LVS
* Top Cell Name: SiPh_LVS
 * View Name:     schematic
************************************
.INCLUDE  source.added
.PARAM


.SUBCKT LVS_Customized
XI1 net1 net2 Opt_dev1 L1=1u
XI2 net2 net3 Opt_dev2 L2=2u
.ENDS
```

SILICON PHOTONICS SYSTEM

CROSS-REFERENCE TO RELATED APPLICATIONS

This application claims the benefit of U.S. Provisional Application No. 63/377,798, filed Sep. 30, 2022, titled "SILICON PHOTONICS SYSTEM" and claims the benefit of U.S. Provisional Application No. 63/345,750, filed May 25, 2022, titled "PHYSICAL VERIFICATION METHODOLOGY AND APR FOR SILICON PHOTONICS INTEGRATED APPLICATIONS," the disclosures of which are hereby incorporated herein by reference.

BACKGROUND

In the integrated circuit design process, a functional description of an integrated circuit is created, and then a circuit design based thereon is created. The circuit design may be verified using simulation tools to ensure that the circuit will operate as desired. The design at this stage may be represented by a circuit schematic or other higher level abstractions. These abstract designs are then converted to physical definitions of the circuit elements to be fabricated. Such a circuit layout represents the geometric boundaries for the physical devices to be fabricated.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. In addition, the drawings are illustrative as examples of embodiments of the invention and are not intended to be limiting.

DETAILED DESCRIPTION

Figure 1:
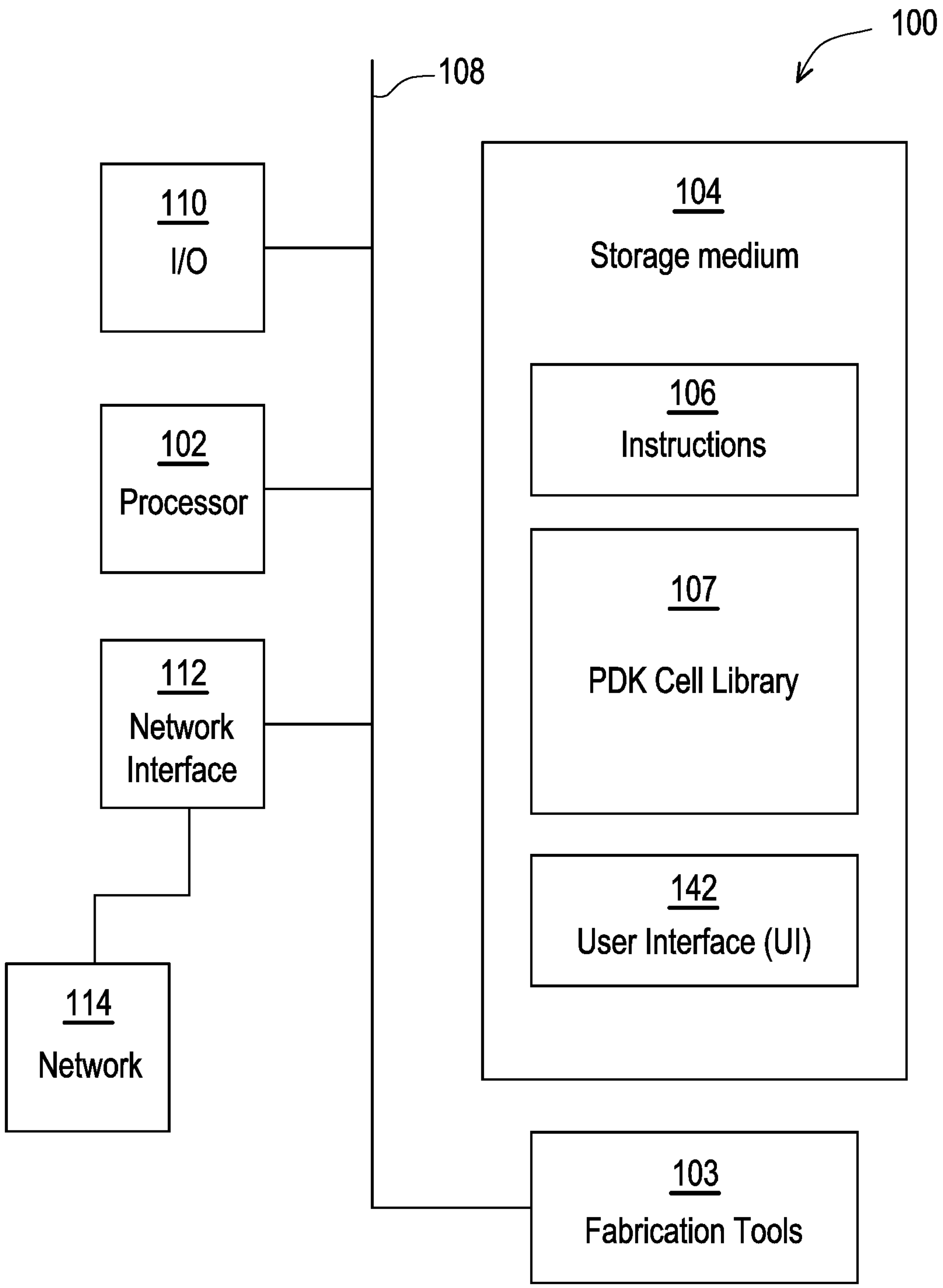
FIG. 1 is a block diagram illustrating an example of a computer system in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Silicon photonics (SiPh) devices may be produced using standard CMOS technology platforms that provide high yield and high volume. Such SiPh devices may also provide performance improvements by replacing electrons with photons in the SiPH devices. Integrated circuits (ICs), including SiPh devices, may be designed using a product development kit (PDK) to facilitate production of a corresponding IC design file. The IC design file comprises one or more files and specifies configuration parameters describing the IC. One or more electronic design automation (EDA) tools receive the design file and creates an IC manufacturing file to fabricate the IC, including fabricating electrical and/or optical devices and routing of conductive and/or optical paths between nodes or terminals of the devices that collectively form circuits. The IC manufacturing file also may specify the manufacturing parameters describing the IC. Such EDA tools include, for example, design rule checker (DRC) tools to detect design rule violations according to specified IC parameters and layout versus schematic (LVS) tools to identify and check IC electrical and/or optical connectivity against IC schematics.

A designed IC may be represented as a schematic or as a layout. Schematic diagrams often include symbols that represent electrical devices such as transistors, resistors, capacitors, and other electrical devices, and optical devices such as reflectors, grating couplers, ring modulators, phase shifters, terminators, and other optical devices. Schematic diagrams also may include representations of the connections between the electrical and/or optical devices included in the schematic. A layout is a representation of an IC in terms of geometric shapes that correspond to the patterns of materials that make up the electrical and/or optical devices of an IC.

Aspects of the present disclosure relate to verifying the connectivity of SiPh devices, including customized SiPh devices. In such SiPh devices, connectivity and routing quality may be difficult to verify. SiPh devices can be highly diverse, making it difficult to cover all verification requirements, for example, in a PDK. The connections between optical devices differ from those of traditional electrical devices. Optical devices connect through a waveguide, or "trench" in the silicon. Moreover, SiPh layout designs are often completed manually; APR approaches may not be available. In conventional SiPh layout processes, there may be no LVS check available for interface layers and no verify function for opens/shorts. This can reduce layout efficiency.

FIG. 1 is a block diagram illustrating various aspects of a computer system implementing an EDA system 100 in accordance with the present disclosure. Some or all of the operations for layout methods disclosed herein are capable of being performed as part of a design procedure performed in a design house, such as the design house 120 discussed below with respect to FIG. 2.

In some embodiments, the EDA system 100 is a general purpose computing device including a processor 102 and a non-transitory, computer-readable storage medium 104. The computer-readable storage medium 104, may be encoded with, for example, computer program code 106 (i.e. a set of executable instructions). Execution of the instructions 106 by the processor 102 represents (at least in part) an EDA tool which implements at least some of various processes and methods described herein (hereinafter, the noted processes and/or methods). Further, fabrication tools 103 may be included for layout and physical implementation of the various IC devices.

The processor 102 is electrically coupled to the computer-readable storage medium 104 via a bus 108. The processor 102 is also electrically coupled to an I/O interface 110 by the bus 108. A network interface 112 is also electrically connected to the processor 102 via the bus 108. The network interface 112 is connected to a network 114, so that the processor 102 and the computer-readable storage medium 104 are capable of connecting to external elements via the network 114. The processor 102 is configured to execute the computer program code 106 encoded in the computer-readable storage medium 104 in order to cause the system 100 to be usable for performing a portion or all of the noted processes and/or methods. In one or more embodiments, the processor 102 is a central processing unit (CPU), a multi-processor, a distributed processing system, an application specific integrated circuit (ASIC), and/or a suitable processing unit.

In one or more embodiments, the computer-readable storage medium 104 is an electronic, magnetic, optical, electromagnetic, infrared, and/or a semiconductor system (or apparatus or device). For example, the computer-readable storage medium 104 includes a semiconductor or solid-state memory, a magnetic tape, a removable computer diskette, a random access memory (RAM), a read-only memory (ROM), a rigid magnetic disk, and/or an optical disk. In one or more embodiments using optical disks, the computer-readable storage medium 104 includes a compact disk-read only memory (CD-ROM), a compact disk-read/write (CD-R/W), and/or a digital video disc (DVD).

In one or more embodiments, the computer-readable storage medium 104 stores computer program code 106 configured to cause the system 100 to be usable for performing a portion or all of the noted processes and/or methods. In one or more embodiments, the computer-readable storage medium 104 also stores information which facilitates performing a portion or all of the noted processes and/or methods. In one or more embodiments, the computer-readable storage medium 104 stores a library 107 of predefined standard optical devices, which may be part of a PDK.

In electronic and SiPh circuit designs, cells are basic units of functionality. A parameterized cell (Pcell) represents a part or a component of the circuit that is dependent on one or more parameters. Thus, it may be generated by EDA tools based on these parameters. A given cell may be placed or instantiated many times. The structures within an integrated circuit and the rules (design rules) governing their physical dimensions are often complex, thereby making the structures difficult to design manually. Using Pcells can increase design productivity and consistency. In some examples, the library 107 stores a plurality of predefined Pcells.

The EDA system 100 includes an I/O interface 110. The I/O interface 110 is coupled to external circuitry. In one or more embodiments, the I/O interface 110 includes a keyboard, keypad, mouse, trackball, trackpad, touchscreen, and/or cursor direction keys for communicating information and commands to the processor 102.

The EDA system 100 also includes a network interface 112 coupled to the processor 102. The network interface 112 allows the system 100 to communicate with the network 114, to which one or more other computer systems are connected. The network interface 112 includes wireless network interfaces such as BLUETOOTH, WIFI, WIMAX, GPRS, or WCDMA; or wired network interfaces such as ETHERNET, USB, or IEEE-1364. In one or more embodiments, a portion or all of noted processes and/or methods, is implemented in two or more systems 100.

The system 100 is configured to receive information through an I/O interface 110. The information received through the I/O interface 110 includes one or more of instructions, data, design rules, optical and/or electrical device definitions, and/or other parameters for processing by processor 102. The information is transferred to the processor 102 via the bus 108. The EDA system 100 is configured to receive information related to a UI through the I/O interface 110. The information is stored in the computer-readable medium 104 as a user interface (UI) 142.

In some embodiments, a portion or all of the noted processes and/or methods is implemented as a standalone software application for execution by a processor. In some embodiments, a portion or all of the noted processes and/or methods is implemented as a software application that is a part of an additional software application. In some embodiments, a portion or all of the noted processes and/or methods is implemented as a plug-in to a software application. In some embodiments, at least one of the noted processes and/or methods is implemented as a software application that is a portion of an EDA tool. In some embodiments, a portion or all of the noted processes and/or methods is implemented as a software application that is used by the EDA system 100. In some embodiments, a layout diagram which includes standard cells is generated using a tool such as VIRTUOSO available from CADENCE DESIGN SYSTEMS, Inc., or another suitable layout generating tool.

In some embodiments, the processes are realized as functions of a program stored in a non-transitory computer readable recording medium. Examples of a non-transitory computer readable recording medium include, but are not limited to, external/removable and/or internal/built-in storage or memory unit, e.g., one or more of an optical disk, such as a DVD, a magnetic disk, such as a hard disk, a semiconductor memory, such as a ROM, a RAM, a memory card, and the like.

As noted above, embodiments of the EDA system 100 may include fabrication tools 103 for implementing the processes and/or methods stored in the storage medium 104. For instance, a synthesis ay be performed on a design in which the behavior and/or functions desired from the design are transformed to a functionally equivalent logic gate-level circuit description by matching the design to predefined devices selected from the standard cell library 107. The synthesis results in a functionally equivalent logic gate-level circuit description, such as a gate-level netlist. Based on the gate-level netlist, a photolithographic mask may be generated that is used to fabricate the integrated circuit by the fabrication tools 103. Further aspects of device fabrication are disclosed in conjunction with FIG. 2, which is a block diagram of IC manufacturing system 101, and an IC manufacturing flow associated therewith, in accordance with some embodiments. In some embodiments, based on a layout diagram, at least one of (A) one or more semiconductor masks or (B) at least one component in a layer of a semiconductor integrated circuit is fabricated using the manufacturing system 101.

Figure 2:
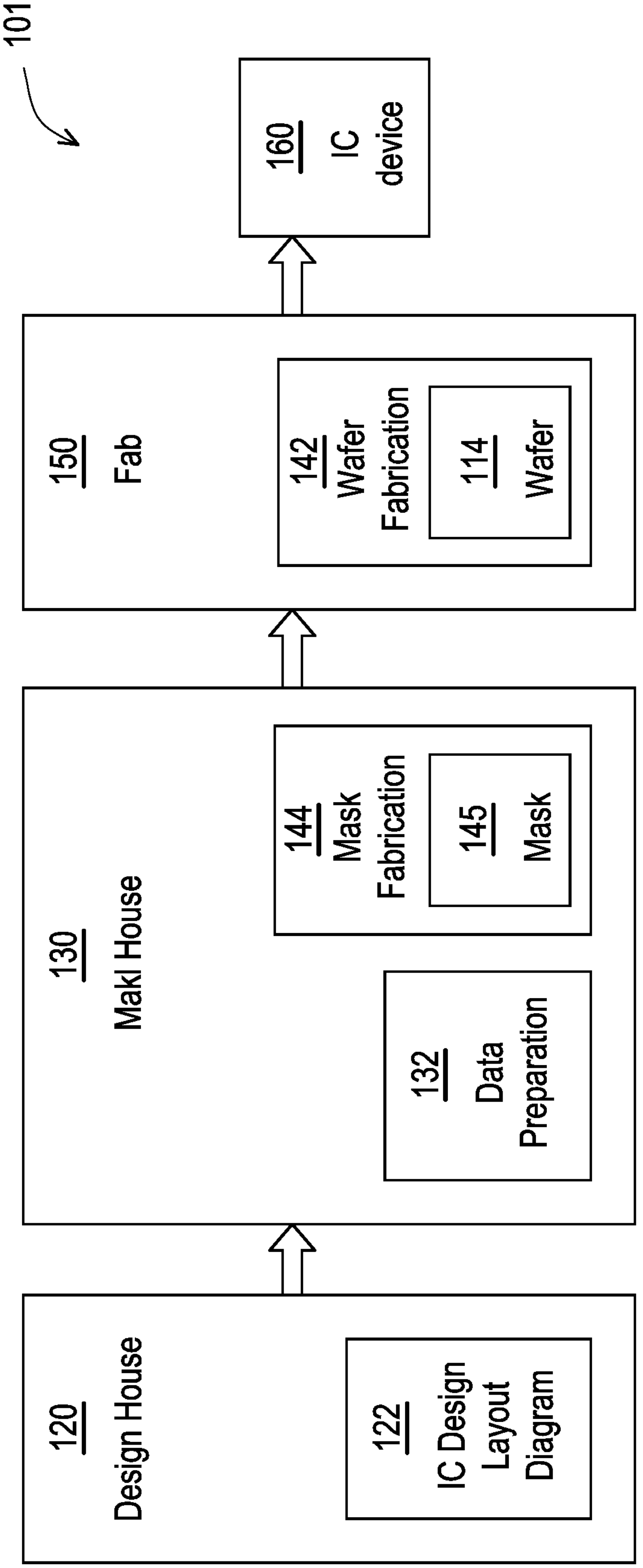
FIG. 2 is a block diagram of an IC manufacturing system and an IC manufacturing flow associated therewith in accordance with some embodiments.

In FIG. 2, the IC manufacturing system 101 includes entities, such as a design house 120, a mask house 130, and an IC manufacturer/fabricator (fab) 150, that interact with one another in the design, development, and manufacturing cycles and/or services related to manufacturing and IC device 160 that includes SiPh devices, such as the SiPh devices disclosed herein. The entities in the system 101 are connected by a communications network. In some embodiments, the communications network is a single network. In some embodiments, the communications network is a variety of different networks, such as an intranet and the Internet. The communications network includes wired and/or wireless communication channels. Each entity interacts with one or more of the other entities and provides services to and/or receives services from one or more of the other entities. In some embodiments, two or more of the design house 120, mask house 130, and IC fab 150 is owned by a single larger company. In some embodiments, two or more of design house 120, mask house 130, and IC fab 150 coexist in a common facility and use common resources.

The design house (or design team) 120 generates an IC design layout diagram 122. The IC design layout diagram 122 includes various geometrical patterns, or IC layout diagrams designed for an IC device, such as an IC device that has various silicon photonics devices as discussed herein. The geometrical patterns correspond to patterns of metal, oxide, or semiconductor layers that make up the various components of IC device to be fabricated. The various layers combine to form various IC features.

The design house 120 implements a design procedure to form an IC design layout diagram 122. The design procedure includes one or more of logic design, physical design or place and route. The IC design layout diagram 122 is presented in one or more data files having information of the geometrical patterns. For example, IC design layout diagram 122 can be expressed in a GDSII file format or DFII file format.

The mask house 130 includes a data preparation 132 and a mask fabrication 144. The mask house 130 uses the IC design layout diagram 122 to manufacture one or more masks 145 to be used for fabricating the various layers of the IC devices according to the IC design layout diagram 122. The mask house 130 performs mask data preparation 132, where the IC design layout diagram 122 is translated into a representative data file (RDF). The mask data preparation 132 provides the RDF to the mask fabrication 144. The mask fabrication 144 includes a mask writer. A mask writer converts the RDF to an image on a substrate, such as a mask (reticle) 145 or a semiconductor wafer 153. The design layout diagram 122 is manipulated by the mask data preparation 132 to comply with particular characteristics of the mask writer and/or requirements of the IC fab 150. In FIG. 2, the mask data preparation 132 and the mask fabrication 144 are illustrated as separate elements. In some embodiments, the mask data preparation 132 and the mask fabrication 144 can be collectively referred to as a mask data preparation.

In some embodiments, the mask data preparation 132 includes an optical proximity correction (OPC) which uses lithography enhancement techniques to compensate for image errors, such as those that can arise from diffraction, interference, other process effects and the like. The OPC adjusts the IC design layout diagram 122. In some embodiments, the mask data preparation 132 includes further resolution enhancement techniques (RET), such as off-axis illumination, sub-resolution assist features, phase-shifting masks, other suitable techniques, and the like or combinations thereof. In some embodiments, inverse lithography technology (ILT) is also used, which treats OPC as an inverse imaging problem.

In some embodiments, the mask data preparation 132 includes a mask rule checker (MRC) that checks the IC design layout diagram 122 that has undergone processes in OPC with a set of mask creation rules which contain certain geometric and/or connectivity restrictions to ensure sufficient margins, to account for variability in semiconductor manufacturing processes, and the like. In some embodiments, the MRC modifies the IC design layout diagram 122 to compensate for limitations during the mask fabrication 144, which may undo part of the modifications performed by OPC in order to meet mask creation rules.

In some embodiments, the mask data preparation 132 includes lithography process checking (LPC) that simulates processing that will be implemented by the IC fab 150 to fabricate the IC device. LPC simulates this processing based on the IC design layout diagram 122 to create a simulated manufactured device. The processing parameters in LPC simulation can include parameters associated with various processes of the IC manufacturing cycle, parameters associated with tools used for manufacturing the IC, and/or other aspects of the manufacturing process. LPC takes into account various factors, such as aerial image contrast, depth of focus (DOF), mask error enhancement factor (MEEF), other suitable factors, and the like or combinations thereof. In some embodiments, after a simulated manufactured device has been created by LPC, if the simulated device is not close enough in shape to satisfy design rules, OPC and/or MRC are be repeated to further refine the IC design layout diagram 122.

It should be understood that the above description of mask data preparation 132 has been simplified for the purposes of clarity. In some embodiments, data preparation 132 includes additional features such as a logic operation (LOP) to modify the IC design layout diagram 122 according to manufacturing rules. Additionally, the processes applied to the IC design layout diagram 122 during data preparation 132 may be executed in a variety of different orders.

After the mask data preparation 132 and during the mask fabrication 144, a mask 145 or a group of masks 145 are fabricated based on the modified IC design layout diagram 122. In some embodiments, the mask fabrication 144 includes performing one or more lithographic exposures based on the IC design layout diagram 122. In some embodiments, an electron-beam (e-beam) or a mechanism of multiple e-beams is used to form a pattern on a mask (photomask or reticle) 145 based on the modified IC design layout diagram 122. The mask 145 can be formed in various technologies. In some embodiments, the mask 145 is formed using binary technology. In some embodiments, a mask pattern includes opaque regions and transparent regions. A radiation beam, such as an ultraviolet (UV) beam, used to expose the image sensitive material layer (e.g., photoresist) which has been coated on a wafer, is blocked by the opaque region and transmits through the transparent regions. In one example, a binary mask version of the mask 145 includes a transparent substrate (e.g., fused quartz) and an opaque material (e.g., chromium) coated in the opaque regions of the binary mask. In another example, the mask 145 is formed using a phase shift technology. In a phase shift mask (PSM) version of the mask 145, various features in the pattern formed on the phase shift mask are configured to have proper phase difference to enhance the resolution and imaging quality. In various examples, the phase shift mask can be attenuated PSM or alternating PSM. The mask(s) generated by the mask fabrication 144 is used in a variety of processes. For example, such a mask(s) is used in an ion implantation process to form various doped regions in the semiconductor wafer 153, in an etching process to form various etching regions in the semiconductor wafer 153, and/or in other suitable processes.

The IC fab 150 includes wafer fabrication 152. The IC fab 150 is an IC fabrication business that includes one or more manufacturing facilities for the fabrication of a variety of different IC products. In some embodiments, the IC Fab 150 is a semiconductor foundry. For example, there may be a manufacturing facility for the front end fabrication of a plurality of IC products (FEOL fabrication), while a second manufacturing facility may provide the back end fabrication for the interconnection and packaging of the IC products (BEOL fabrication), and a third manufacturing facility may provide other services for the foundry business.

The IC fab 150 uses mask(s) 145 fabricated by the mask house 130 to fabricate disclosed IC devices. Thus, the IC fab 150 at least indirectly uses the IC design layout diagram 122 to fabricate the IC devices. In some embodiments, the semiconductor wafer 153 is fabricated by the IC fab 150 using mask(s) 145. In some embodiments, the IC fabrication includes performing one or more lithographic exposures based at least indirectly on the IC design layout diagram 111. The Semiconductor wafer 153 includes a silicon substrate or other proper substrate having material layers formed thereon. The semiconductor wafer 153 further includes one or more of various doped regions, dielectric features, multilevel interconnects, and the like (formed at subsequent manufacturing steps).

EDA tools such as the EDA system 100 discussed above allow designers to develop an IC design at the schematic level and verify performance at the schematic level via a pre-layout simulation. If the pre-layout simulation demonstrates that the IC design at the schematic level meets specified performance characteristics, EDA tools generate a layout and perform verification tasks such as design rule checks (DRC) and layout versus schematic (LVS) checks. DRC checks compare the layout to a set of design rules that satisfy a series of recommended parameters set forth by an IC manufacturer to ensure that a manufactured IC functions properly. Design rule sets specify certain geometric and connectivity restrictions to ensure sufficient margins to account for variability in the manufacturing process. LVS checks are often performed after the DRC is complete. EDA tools usually perform LVS checks by extracting the device parameters and connection parameters of the devices and the connections between the devices, and generating a layout netlist. An EDA tool then compares the layout netlist to the schematic netlist. If the layout netlist and the schematic netlist match within a specified tolerance or are identical, then the layout is "LVS clean."

Differences between conventional integrated circuits and photonic integrated circuits exist in the definition of their respective devices. Conventional electronic devices, such as transistors, may be extracted during the LVS process based on their layout features. For example, an overlap of a polysilicon gate layer and an active layer can be identified as a transistor instance. In electrical circuits, touching or overlap of layout geometries usually identifies a continuous signal channel. In photonic circuits, however, waveguide crossings (electronically shorted and optically open) and directional couplers (electronically open and optically shorted), may not be identifiable based on layout features, and instead may be explicitly identified as photonic integrated circuit devices to ensure that the optical signal will travel the correct path via the defined ports based on parameters of corresponding Pcells.

Moreover, parameter extraction for photonic devices can be difficult due to the curvilinear feature of photonic designs. Curvilinear properties such as curvilinear path length and bend curvature determine the device function or signal continuity of a waveguide interconnection path. It is thus desirable to verify device features such as path length difference, bend curvature, radiation loss, etc. based on extracted Pcell parameters.

In accordance with some disclosed aspects, such parameters for some SiPh devices are provided in predefined device descriptions in the PDK cell library 107. However, it can difficult to provide numerous predefined photonic device cells in PDK libraries since such optical devices can be highly diverse and can vary significantly. Moreover, connections for photonic devices can be difficult to check or verify as compared to electrical devices. Where conventional electrical devices typically electrically connect to one another through metal layers, optical devices need a clear optical path provided in a waveguide or "trench" formed in silicon.

In some disclosed embodiments, an IC design system facilitates verification processes such as LVS verification for SiPh devices. Various disclosed implementations may employ recognition or "dummy" layers and text labels to recognize instances of photonic structures to facilitate LVS for SiPh devices. Such dummy layers would not exist on the manufacturing mask, and may further be referred to herein as design layers or physical property layers that provide property-oriented information. The photonics design layers are then processed to generate mask layers for the actual masks used to manufacture the photonic device(s).

Figure 3:
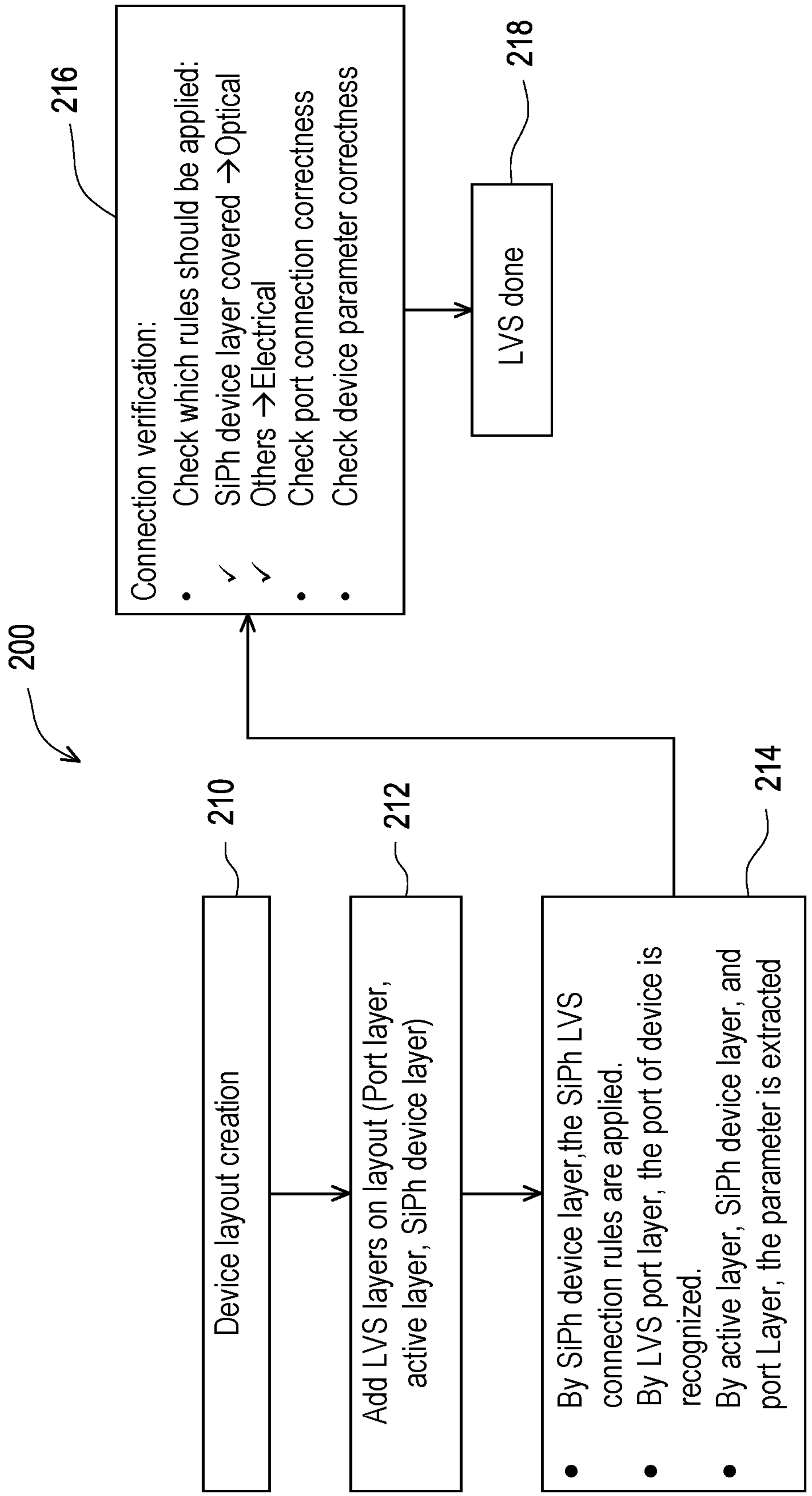
FIG. 3 is a flow diagram illustrating an example of a layout vs. schematic (LVS) method in accordance with some embodiments.

In accordance with some disclosed examples, devices are formed with limited dummy layers for the LVS recognition. The number of dummy recognition layers is thus reduced to simplify the LVS process. FIG. 3 illustrates an example LVS flow 200 in accordance with some disclosed embodiments. At operation 210, a photonic device layout is created, and at operation 212 dummy layers for the device layout are added. In some examples, the dummy layers add text labels to recognize instances of photonic structures to facilitate LVS for the SiPh devices. The dummy layers further may provide property-oriented information. In some examples, minimal dummy layers (e.g. three or fewer layers) are used to simply the process. In FIG. 3, the dummy layers include a port layer used to recognize ports (connections) of the device, an optical active layer that defines optics parameters, and an optic device layer that names the device.

Figure 4:
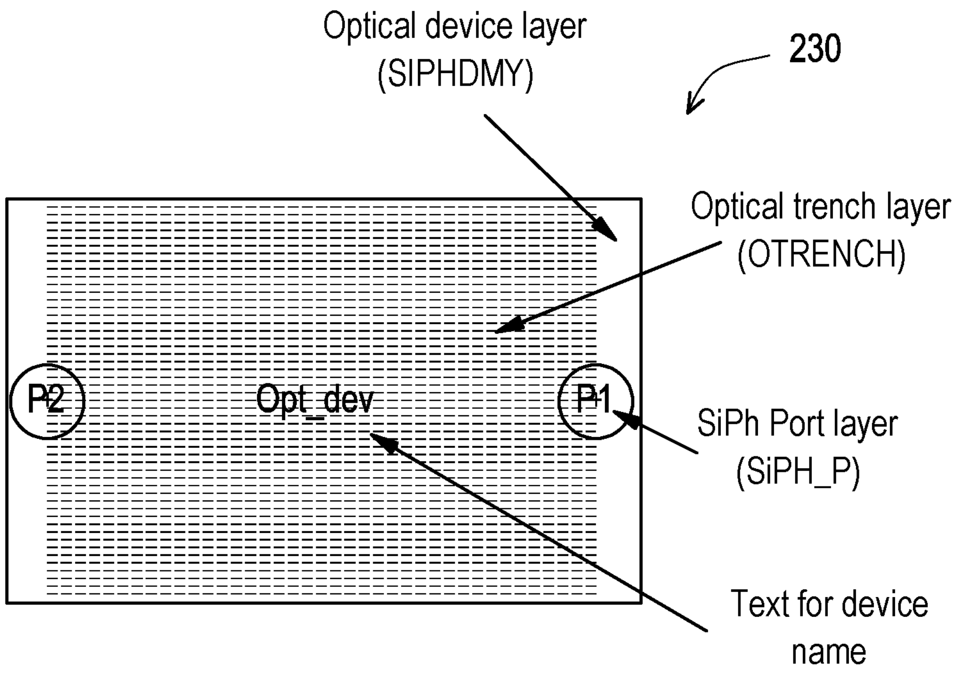
FIG. 4 is a block diagram illustrating examples of dummy layers for an optical device layout in accordance with some embodiments.

FIG. 4 illustrates an example of the dummy layers for a device layout 230, showing the optic device layer (SIPHDMY) providing text for the device name "Opt dev," the port layer (SiPH_P) defining the connection ports P1 and P2, and the active or trench layer (OTRENCH) that defines parameters such as for the trench or waveguide of the device.

Figure 5:
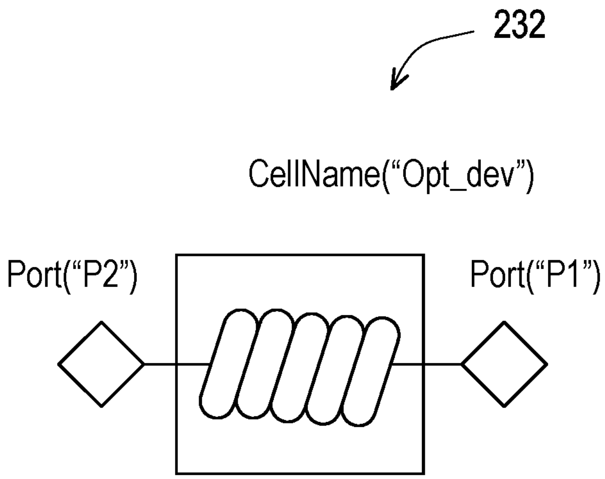
FIG. 5 illustrates an example of a schematic symbol for the device layout shown in FIG. 4 in accordance with some embodiments.
Figure 6:
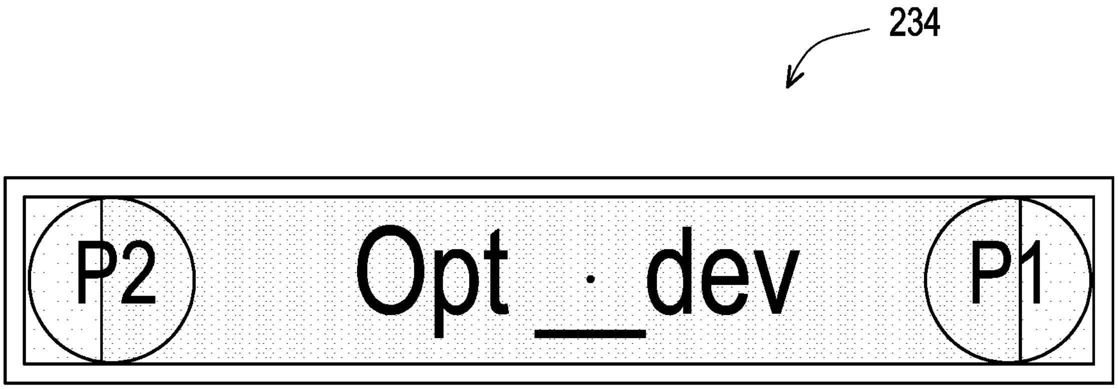
FIG. 6 illustrates an example of a Pcell representation of the device layout shown in FIG. 4 in accordance with some embodiments.
Figure 7:
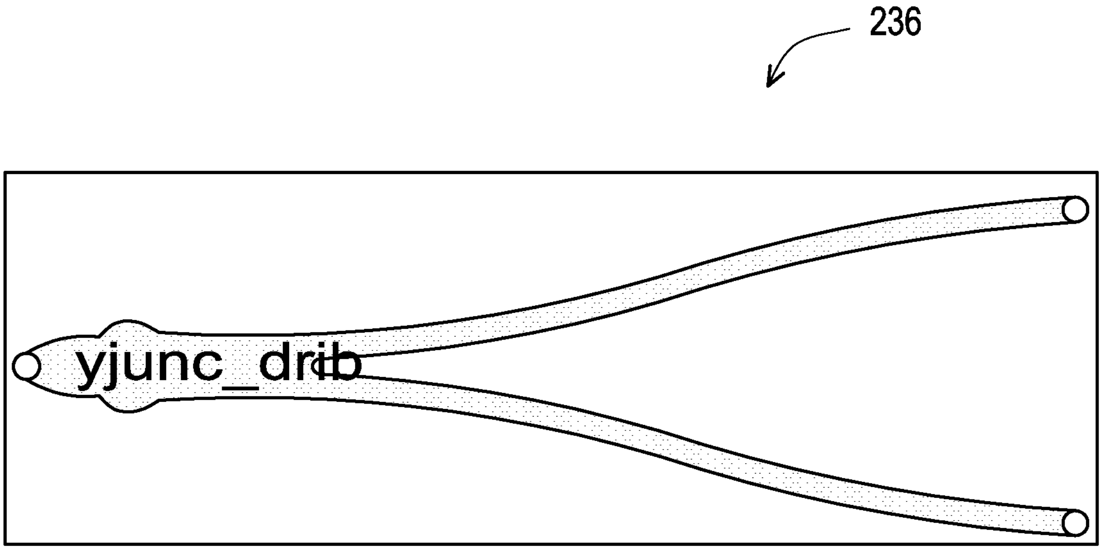
FIG. 7 illustrates an example of a fixed cell representation of the device layout shown in FIG. 4 in accordance with some embodiments.

Referring back to FIG. 3, in operation 214 LVS rules are determined based on the dummy layers added in operation 212. For example, as shown in FIG. 4, the device layer SIPHDMY identifies an optical device. As such, SiPh LVS rules are applied in operation 214. Device ports (i.e. P1 and P2) are recognized based on the port layer SiPH_P, and for a Pcell, the device parameters are extracted in operation 214 based on the active layer, device layer and port layer. FIG. 5 illustrates an example of a symbol 232 for the device layout 230, while FIGS. 6 and 7 illustrate examples of a corresponding Pcell 234 and fixed cell 236.

In operation 216, an LVS verification based on the LVS rules is conducted. For instance, for an optical device such as shown in the device layout 230, optical LVS rules are applied. For electrical devices or hybrid devices, other rules may be applied. Using the identified port information from the port layer SiPH_P, port connections are verified, and device parameters are checked based on the various dummy layers. Once the LVS verifications of operation 216, the LVS check is complete at operation 218.

Figures 8, 9:
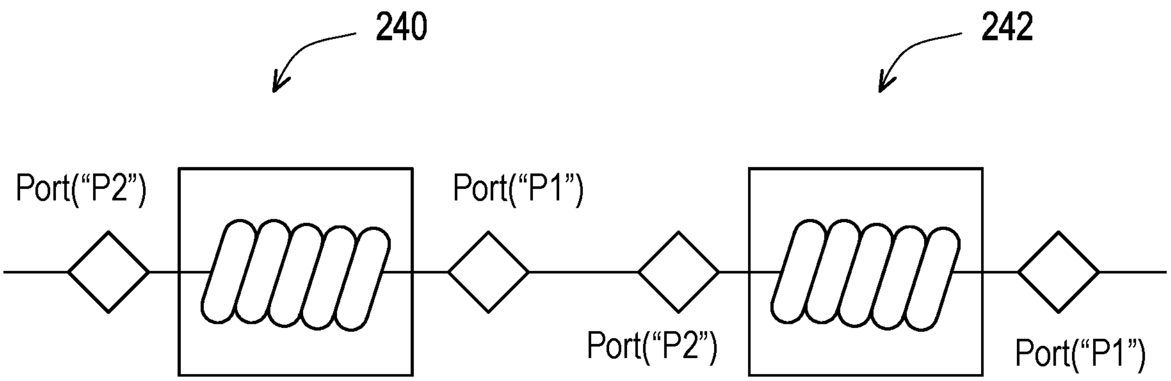
FIG. 8 is a schematic diagram illustrating an example of portions of optic circuit in accordance with some embodiments.
FIG. 9 is a chart illustrating examples of parameters extracted from Pcell dummy layers in accordance with some embodiments.

FIG. 8 illustrates a schematic view showing an optic circuit with schematic symbols for two Pcells 240, 242 having connected ports. For an LVS process such as the flow 200 shown in FIG. 3, Pcell parameters are extracted based on the optic device layer SIPHDMY, the port layer SiPH_P and the active or trench layer OTRENCH. The port layer SiPH_P provides cross point measurement parameters to define port connection locations. As shown in the schematic view of FIG. 8, port P1 of the first device 240 is connected to port P2 of the second device 242.

Figure 10:
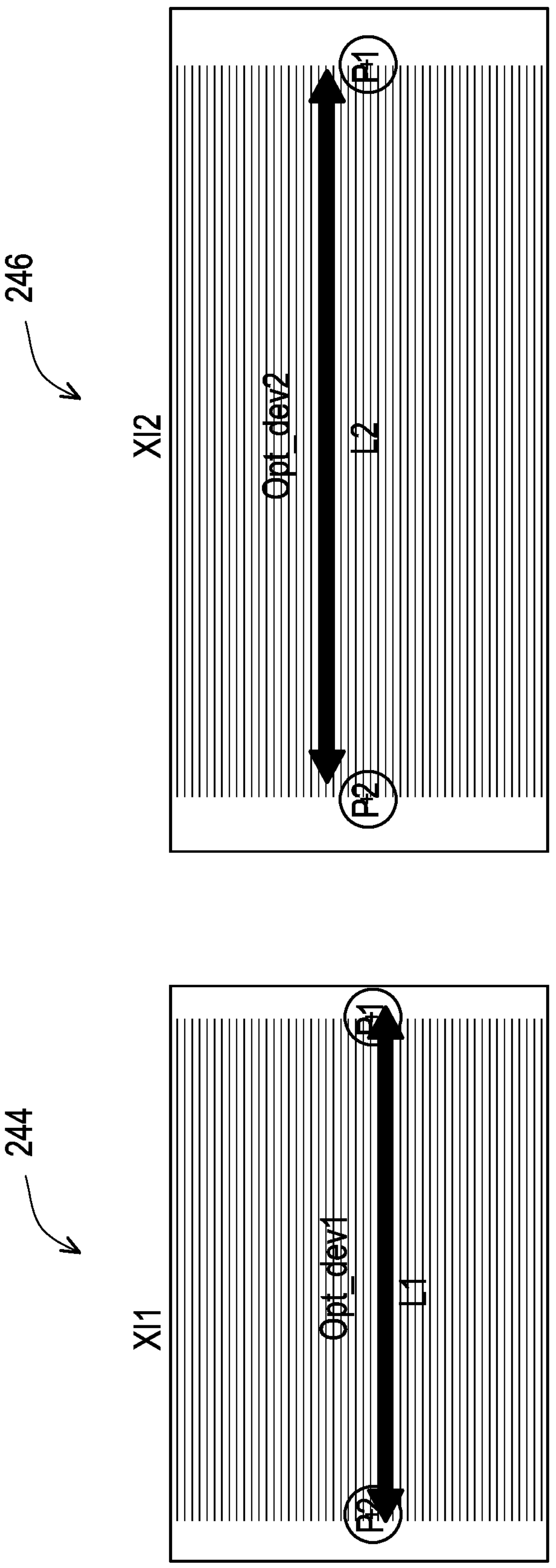
FIG. 10 illustrates examples of Pcells corresponding to devices illustrated in the schematic view of FIG. 8 in accordance with some embodiments.
Figure 11:
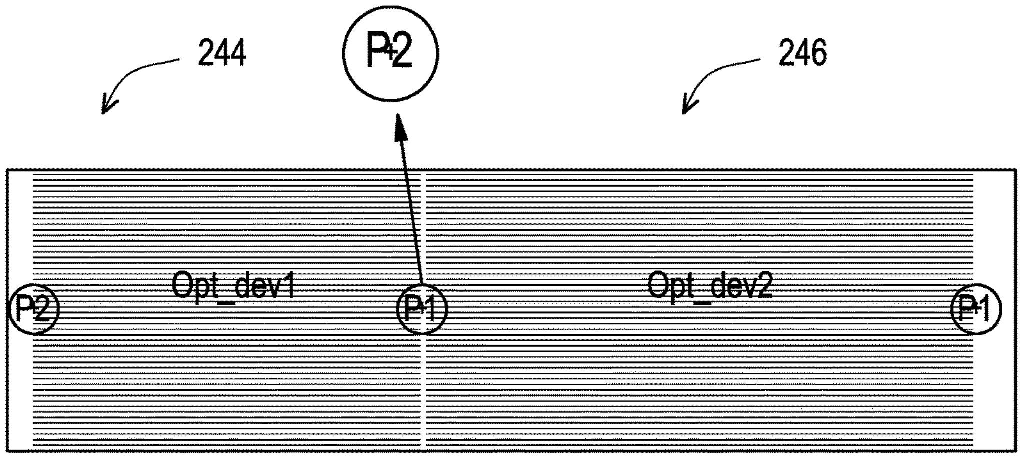
FIG. 11 is a layout view illustrating port connections of the example Pcells shown in FIG. 10 in accordance with some embodiments.

FIG. 9 illustrates examples of parameters extracted from dummy layers of the Pcells corresponding to the devices 240, 242 shown in the schematic view of FIG. 8, and FIG. 10 shows examples of the Pcells 244, 246 corresponding to the devices 240, 242 respectively. Based on the OTRENCH layer, device parameters L1 and L2 are extracted to define the device optic path lengths of 1*u* and 2*u*, respectively. The SIPHDMY layer identifies the device names Opt_dev1 and Opt_dev2, and the port connection information is extracted from the SiPH_P layer. Among other things, the SiPH_P port layer defines cross point measurements for the port connections, and as shown in the layout of FIG. 11, if the identified cross point measurements for Opt_dev1 P1 and Opt_dev2 P2 fully overlap, the contact is verified.

Figure 12:
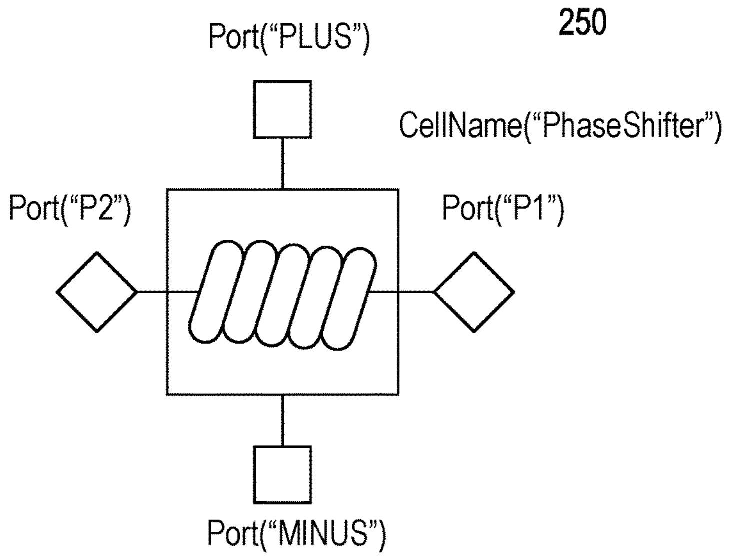
FIG. 12 illustrates an example of a schematic symbol for a hybrid device in accordance with some embodiments.
Figure 13:
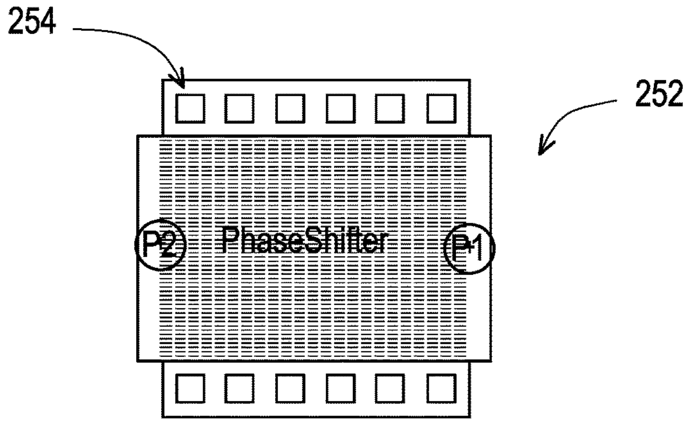
FIG. 13 illustrates an example of a Pcell for the hybrid device illustrated in FIG. 12 in accordance with some embodiments.

FIG. 12 illustrates an example schematic symbol for a hybrid device 250 (electrical+optical), and FIG. 13 is an example of a corresponding Pcell 252 for the hybrid device 250. As shown in the schematic symbol for the device 250 in FIG. 12, the device 250 is a phase shifter with two optical connection ports P1 and P2, and positive and negative electrical connection terminals PLUS and MINUS. The dummy layers for the corresponding Pcell 252 layout shown in FIG. 13 thus identify the optical ports P1 and P2 in the SiPH layer, along with the electrical contact terminals PLUS and MINUS formed in a metal layer 254. The device layer SIPHDMY includes text to identify the device name "Phase-Shifter" and the active layer OTRENCH provides additional parameters for the device. Thus, for the LVS process, additional LVS rules would be extracted from the dummy layers, including electrical LVS rules in addition to the optical LVS rules.

In some implementations, the PDK cell library 107 shown in FIG. 1 stores a library of predefined Pcells for SiPh devices and their associated parameters. As noted herein, since photonic devices can be highly diverse, there may be instances where a desired Pcell is not included in the cell library 107. Some embodiments allow designing ICs that include both "standard" SiPh devices for which standard cells are stored in the cell library 107, as well as custom SiPh devices. Such custom devices may be defined as described in for the LVS flow discussed herein above, where various dummy layers are provided to identify parameters of the SiPh Pcell.

"Place and route" refers to a design stage that includes determining locations of the various electrical and/or optical circuit components, and determining the electrical and/or optical connections of the placed components. This is often implemented by automated processes executed by an EDA system (e.g. the system 100 shown in FIG. 1), and is thus referred to as "automated placement and routing" (APR). Among other things, ADR implements the desired electrical and/or optical connections while following the rules and limitations of the manufacturing processes discussed above.

Figure 14:
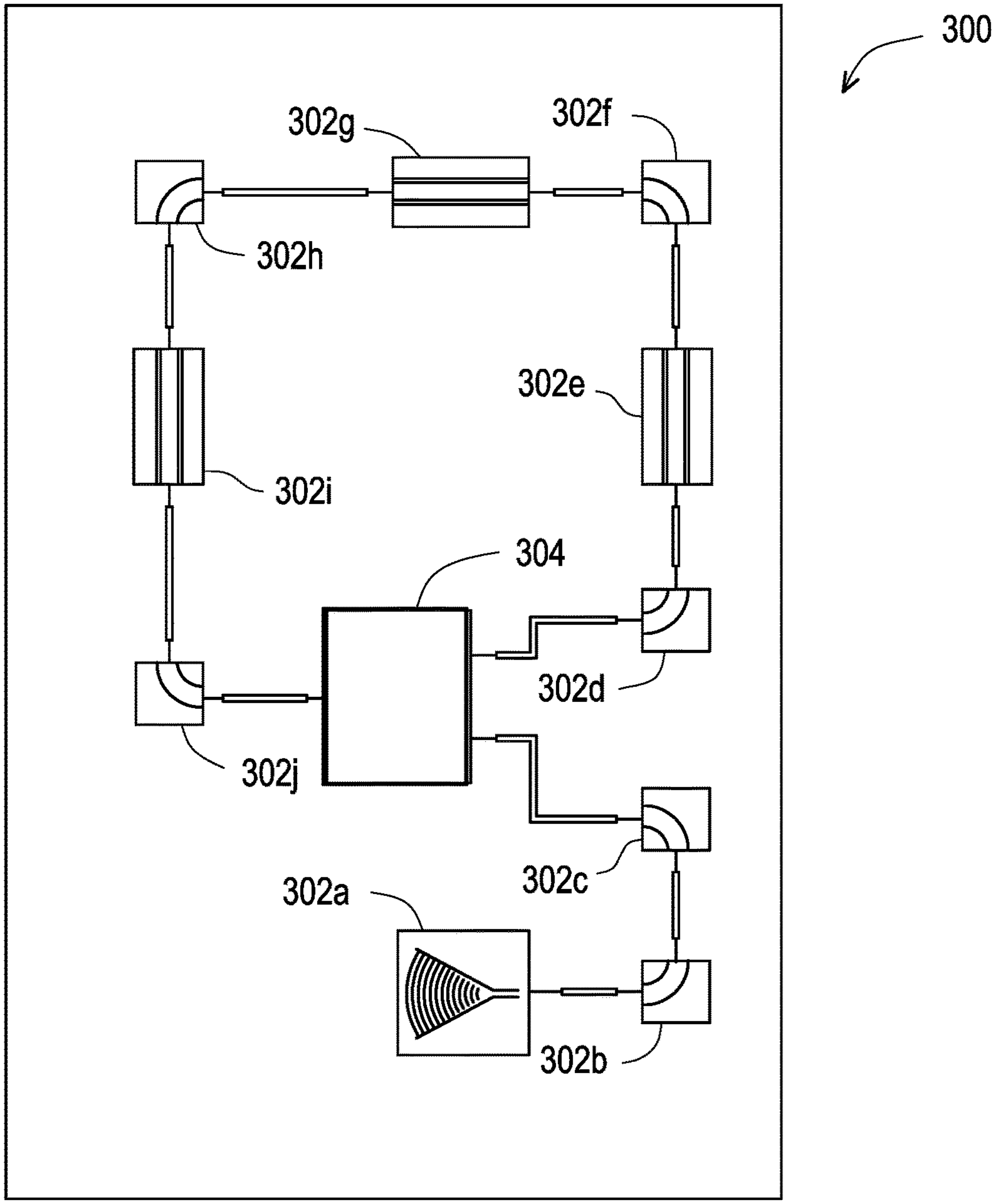
FIG. 14 is an example of a schematic diagram for an optical device circuit in accordance with some embodiments.

In some disclosed embodiments, an IC design system provides an APR system that is operable with custom SiPh devices as well as standard SiPh devices, and further facilitates verification processes such as the LVS verification illustrated in FIG. 3 and discussed above. FIG. 14 is a schematic view of such a circuit 300, which includes a plurality of standard Pcells 302*a-j* (collectively standard Pcells 302) stored in the cell library 107, as well as a custom photonic device 304. The standard Pcells 302 may include photonic devices such as waveguides (e.g. 302*e*, 302*g*, 302*i*) waveguides having 90 degree bends (e.g. 302*b*, 302*c*, 302*d*, 302*f*, 302*h*, 302*j*), and an optical input/output such as grating coupler or edge coupler 302*a*. The custom SiPh device may be defined using dummy cells as discussed in conjunction with FIGS. 3-13 above for the LVS process.

Figure 15:
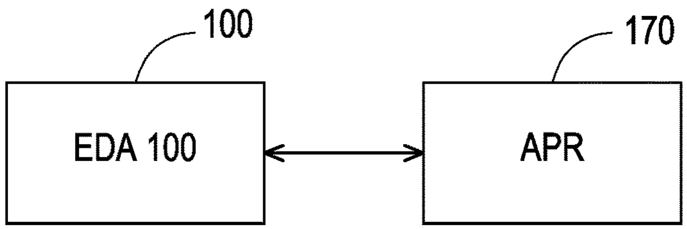
FIG. 15 is a block diagram illustrating aspects of an example automatic place in route (APR) system in accordance with some embodiments.

Often, SiPh layout design is completed manually, which is slow and expensive. The optical APR flow disclosed herein can significantly reduce layout cycle time, and can be used with existing CMOS processes. Design rules are generally provided, for example, to specify spacing of layout patterns to ensure the patterns can be accurately transferred to the wafer during manufacturing. Typically, the fab 150 defines a manufacturing grid on which layout patterns may be placed, and the EDA system 100 stores the grid, such in the storage medium 104. The APR system may be a component of the EDA system 100, or as shown in FIG. 15, may be an external system that interfaces with the EDA 100. In such implementations, the APR 170 may be implemented by a computer system similar to that described in conjunction with FIG. 1.

Figure 16:
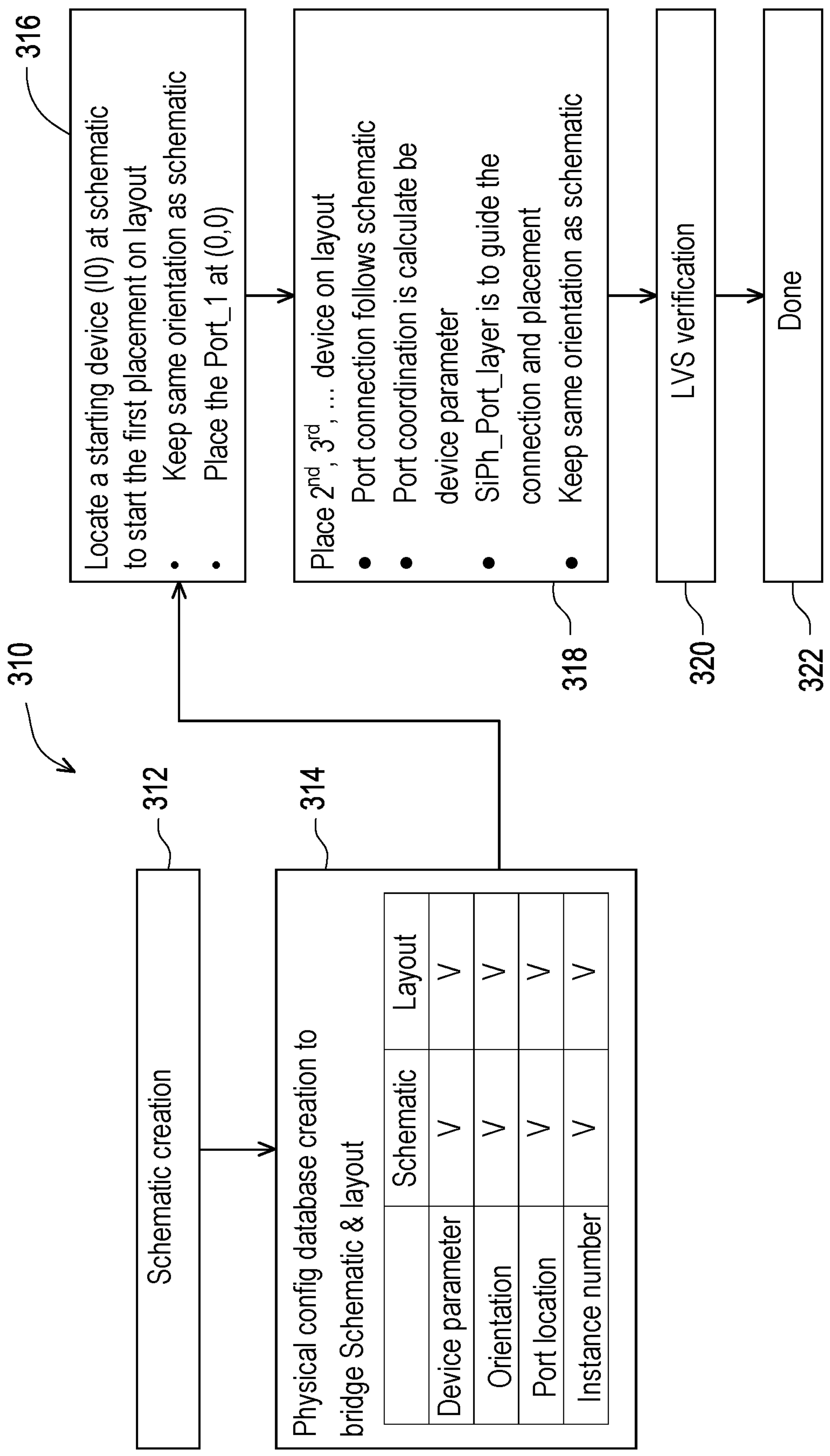
FIG. 16 is a flow diagram illustrating aspects of an example APR method in accordance with some embodiments.

FIG. 16 illustrates an example of an ADR flow 310 in accordance with disclosed embodiments. At an operation 312, a schematic is created, such as the schematic 300 shown in FIG. 14. A configuration database is created at operation 314 to correlate various parameters of devices included in the schematic with a corresponding layout. In the example operation 314, the database includes elements such as the device parameter, orientation of the device, port locations, instance number, and the like. The database information may be stored in the storage medium 104 of the EDA system 100.

As noted above, layout patterns for IC devices may be placed on a manufacturing grid. Such a grid may be stored, for example, in the storage medium 104 of the EDA system 100. At operation 316 of FIG. 16, a starting device 10 point is identified in the schematic to identify a starting point on the grid for the layout. Referring to the schematic shown in FIG. 14, the "net13" port of the coupler 302*a* could be identified as such a starting point "Port_1" for operation 316 of FIG. 16. This starting point is placed at coordinate (0,0) of the manufacturing grid. The device parameter, orientation, port locations, etc. are defined in the database created at operation 314. Thus, the location for other port(s) of the device 302*a* are noted in the database. Based on this information, subsequent devices of the schematic are sequentially placed on the layout in operation 318. The port connections for the layout follow those established on the schematic.

Figure 17:
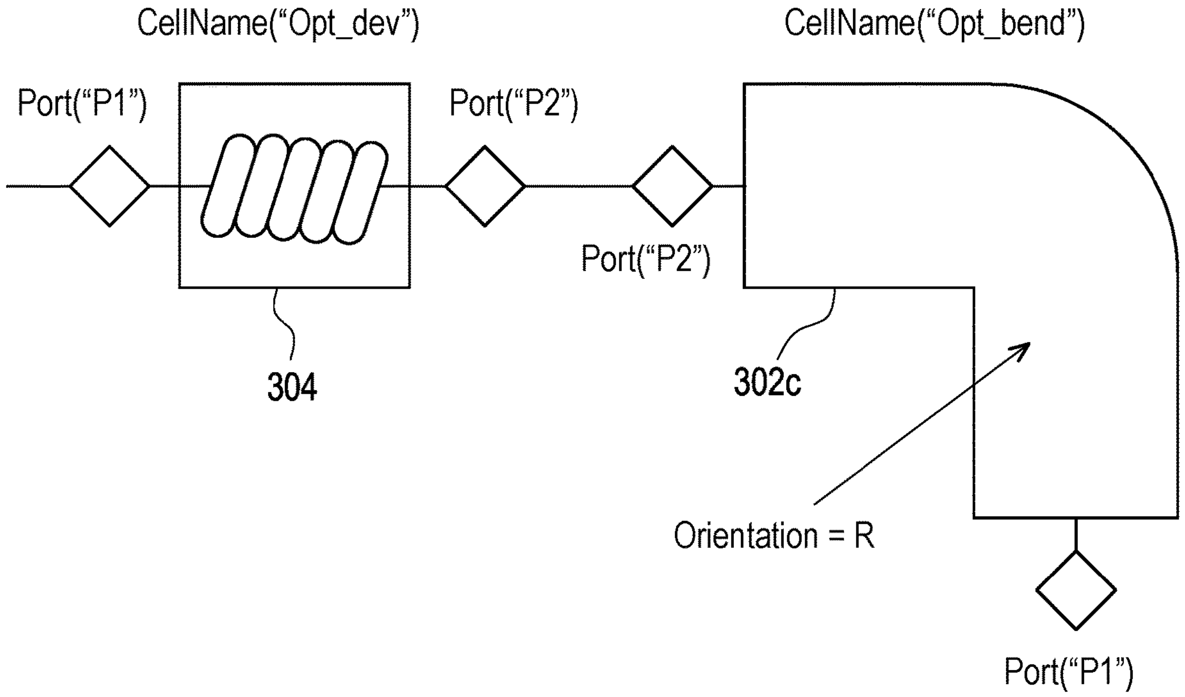
FIG. 17 is a schematic diagram illustrating portions of an example optic device circuit in accordance with some embodiments.
Figure 18:
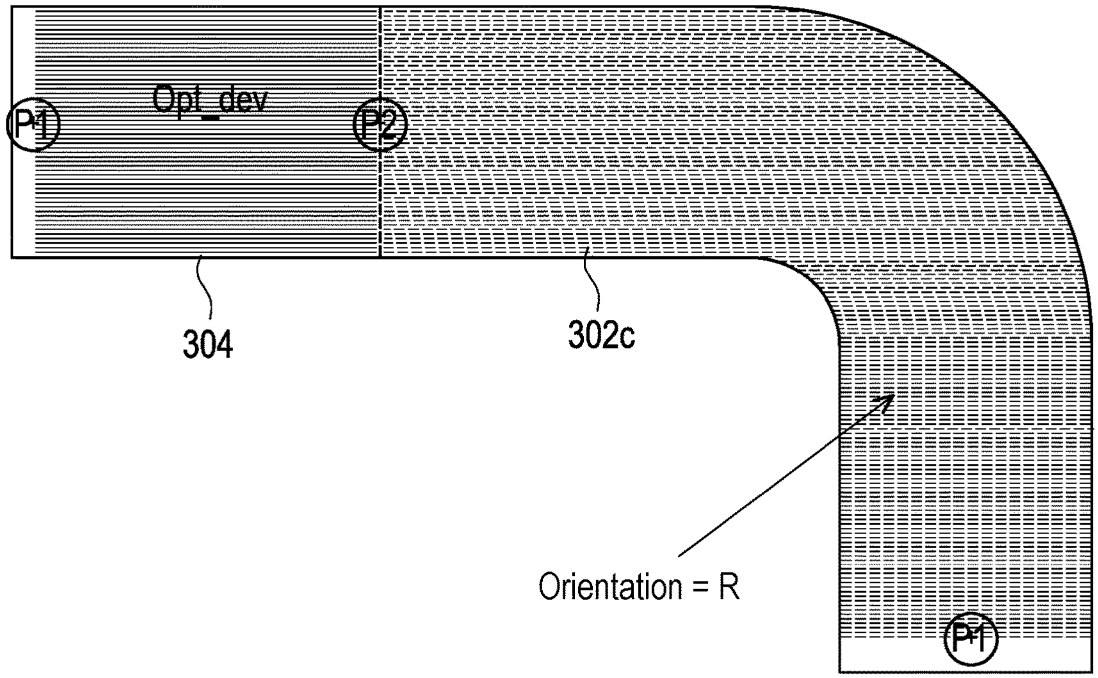
FIG. 18 is a layout diagram corresponding to the schematic diagram shown in FIG. 17 in accordance with some embodiments.

FIG. 17 illustrates an example of a portion of a schematic, wherein the custom device 304 connects to a standard device 302 defined in the PDK. In FIG. 17, the custom device 304 may be the "Op dev" custom SiPh device shown in FIGS. 4-7 and described in conjunction therewith. The schematic of FIG. 17 shows the port P2 of the custom device 304 connecting to port P2 of the standard device 302*c*. For the custom device 304, port information may be defined in the SiPH_P port layer of the Pcell for the device 304. Port information for the standard devices, such as the device 302*c*, may be provided in the PDK device library 107. Based on the information provided in the configuration database of operation 314, the ADR system "overlaps" the port connections to properly place the waveguide trench. As shown by the Pcell diagrams of FIG. 18, the P2 port of the custom device 304 overlaps with the P2 port of the standard device 302*c* in accordance with the configuration information, insuring proper placement of the SiPh devices.

Figure 19:
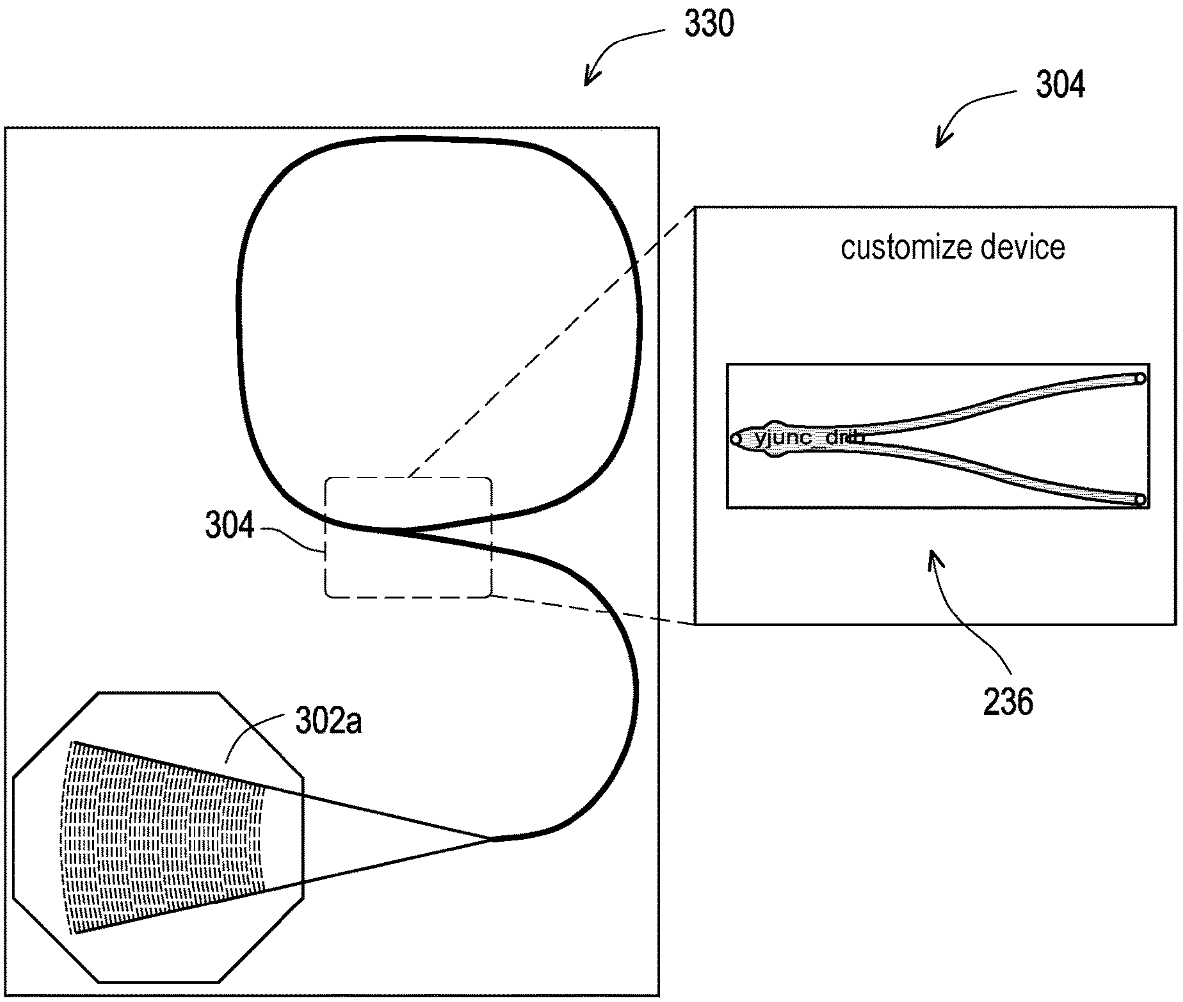
FIG. 19 is a layout diagram corresponding to the schematic diagram shown in FIG. 14 in accordance with some embodiments.

FIG. 19 illustrates a completed layout 330 corresponding to the schematic 300 of FIG. 14. The layout 330 includes the custom device 304, which in the illustrated example is the custom device 236 shown in FIG. 7.

In some implementations, once all of the devices have been placed in operation 318, an LVS verification is conducted in operation 320. The LVS verification 320 may be conducted in accordance with the LVS process 200 discussed herein above. The ADR process 310 completes at operation 322 following the LVS 320.

Thus, aspects of the disclosure provide a verification methodology where minimal dummy layers are provided for LVS verification. This makes it easier to verify LVS flow for customized devices. This allows customized devices to be included, shortening the time-to-market for new processes. Further, LVS verification cycle time is reduced. In some examples, a 95% improvement is realized. Further, optical APR is provided, reducing the layout cycle time (95% improvement in some examples). Still further, the disclosed processes are technology independent, allowing various CMOS process nodes to be used. The verification processes are structure independent (i.e. 2D, 2.5D, 3D), and tools independent.

In accordance with aspects of the disclosure, an LVS method includes creating a photonic device layout and defining a plurality of dummy layers for the device layout including a port layer, an active layer, and a device layer. Layout vs schematic (LVS) connection rules are applied based on the device layer. A port of the photonic device is recognized based on the port layer, and a parameter of the photonic device is extracted based on the active layer, the device layer, and the port layer. An LVS verification is conducted based on the LVS rules, including verifying port connections of the photonic device.

In accordance with further aspects, an APR system includes a storage medium storing a product development kit (PDK) cell library with parameters for standard silicon photonic (SiPh) device parameterized cells (Pcells), a custom SiPh layout including a plurality of dummy layers defining a custom SiPh device Pcell, and a schematic including a plurality of the standard SiPh device Pcells and the custom SiPh device Pcell. A configuration database correlates the standard SiPh device Pcells and the custom SiPh Pcell to the schematic. A computer system is operable to automatically place and route the standard SiPh device Pcells and the custom SiPh Pcell based on the configuration database.

In accordance with additional aspects of the disclosure, a method includes providing a PDK cell library including parameters for standard SiPh device parameterized cells (Pcells). A custom SiPh layout that includes a plurality of dummy layers defining a custom SiPh device Pcell is created. A schematic including a plurality of the standard SiPh device Pcells and the custom SiPh device Pcell is created, as well as a configuration database correlating the standard SiPh device Pcells and the custom SiPh Pcell to the schematic. The standard SiPh device Pcells and the custom SiPh Pcell are automatically placed and routed based on the configuration database. A plurality of LVS rules are determined based on the dummy layers, and an LVS verification is conducted based on the LVS rules.

This disclosure outlines various embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:

creating a photonic device layout;

defining a plurality of dummy layers for the device layout including a port layer, an active layer, and a device layer;

applying layout vs schematic (LVS) connection rules based on the device layer;

recognizing a port of the photonic device based on the port layer;

extracting a parameter of the photonic device based on the active layer, the device layer, and the port layer; and conducting an LVS verification based on the LVS rules, including verifying port connections of the photonic device and verifying device parameter correctness based on the active layer, wherein the device parameter includes waveguide parameters.

2. The method of claim 1, wherein the plurality of dummy layers includes three or fewer layers.

3. The method of claim 1, wherein the device layer includes a Silicon Photonics (SiPh) device layer.

4. The method of claim 3, wherein the photonics device is a parameterized cell (Pcell).

5. The method of claim 1, wherein conducting the LVS verification includes verifying waveguide length.

6. The method of claim 1, wherein the photonics device includes an optical layer and an electrical layer, and wherein the method further comprises applying optical LVS rules and electrical LVS rules.

7. The method of claim 6, wherein verifying port connections includes verifying optical connections and electrical connections.

8. The method of claim 1, further comprising creating a configuration database correlating the plurality of dummy layers to a schematic.

9. The method of claim 8, further comprising:

providing a product development kit (PDK) cell library storing a plurality of standard photonic device layouts; and automatically placing and routing the photonic device layout and the plurality of standard photonic device layouts based on the configuration database.

10. The method of claim 9, wherein automatically placing and routing is conducted by a computer system.

11. The method of claim 9, wherein automatically placing and routing includes overlapping a first port connection location of the photonic device layout and a second port connection location of one of the plurality of standard photonic device layouts on a manufacturing grid.

12. The method of claim 9, further comprising fabricating an integrated circuit (IC) based on the automatic placing and routing.

13. A method, comprising:

providing a product development kit (PDK) cell library storing a plurality of standard photonic device definitions;

creating a custom photonic device definition;

defining a plurality of dummy layers for the custom photonic device definition including a port layer, an active layer, and a device layer;

creating a schematic including a plurality of standard photonic devices based on the standard photonic device definitions and a custom photonic device based on the custom photonic device definition;

applying layout vs schematic (LVS) connection rules based on the PDK cell library and the device layer;

recognizing a port of the custom photonic device based on the port layer;

extracting a parameter of the custom photonic device based on the active layer, the device layer, and the port layer; and conducting an LVS verification based on the LVS rules, including verifying port connections of the standard photonic devices and the custom photonic device.

14. The method of claim 13, wherein conducting the LVS verification includes verifying waveguide length.

15. The method of claim 13, further comprising creating a configuration database correlating the plurality of dummy layers to the schematic.

16. The method of claim 13, further comprising fabricating an integrated circuit (IC) based on the automatic placing and routing.

17. The method of claim 16, further comprising automatically placing and routing the plurality of standard photonic devices and the custom photonic device based on the configuration database.

18. A system, comprising:

a storage medium storing:

a product development kit (PDK) cell library including a plurality of standard silicon photonic device definitions;

a custom silicon photonic device definition including a plurality of dummy layers including a port layer, an active layer, and a device layer;

a schematic including a plurality of the standard silicon photonic devices based on the plurality of standard silicon photonic device definitions and a custom silicon photonic device based on the custom silicon photonic device definition;

a configuration database correlating the plurality of standard silicon photonic devices and the custom silicon photonic device to the schematic; and a computer system operable to access the storage medium and apply layout vs schematic (LVS) connection rules based on the PDK cell library and the device layer to conduct an LVS verification, including verifying a waveguide length based on the active layer.

19. The system of claim 18, wherein the computer system is further operable to automatically place and route the plurality of standard photonic devices and the custom photonic device based on the configuration database.

20. The system of claim 18, wherein the LVS verification includes verifying port connections of the plurality of standard silicon photonic devices and the custom silicon photonic device.

* * * * *